US012656382B2

(12) United States Patent
Ruengeler et al.

(10) Patent No.: US 12,656,382 B2
(45) Date of Patent: Jun. 16, 2026

(54) MEASUREMENT INSTRUMENT FOR MEASURING A RADIO FREQUENCY SIGNAL

(71) Applicant: Rohde & Schwarz GmbH & Co. KG, Munich (DE)

(72) Inventors: Matthias Ruengeler, Munich (DE); Christian Soldner, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 213 days.

(21) Appl. No.: 18/422,525

(22) Filed: Jan. 25, 2024

(65) Prior Publication Data

US 2025/0244371 A1     Jul. 31, 2025

(51) Int. Cl.
| | |
|---|---|
| *G01R 29/08* | (2006.01) |
| *G01R 15/09* | (2006.01) |
| *H04B 17/20* | (2015.01) |
| *H04B 17/309* | (2015.01) |
| *H04B 17/318* | (2015.01) |

(52) U.S. Cl.
CPC ............. *G01R 29/08* (2013.01); *G01R 15/09* (2013.01); *H04B 17/202* (2023.05); *H04B 17/318* (2015.01); *H04B 17/346* (2023.05)

(58) Field of Classification Search
CPC ........ G01R 29/08; G01R 15/09; G01R 27/00; G01R 27/04; G01R 27/32; H04B 17/318; H04B 17/346; H04B 17/202

USPC ......................................................... 324/629
See application file for complete search history.

(56) References Cited

U.S. PATENT DOCUMENTS

| | | | |
|---|---|---|---|
| 4,578,638 A | 3/1986 | Takano et al. | |
| 6,359,429 B1 | 3/2002 | Arai et al. | |
| 2018/0335480 A1* | 11/2018 | Lv ............................ | G01R 35/00 |
| 2020/0233827 A1* | 7/2020 | Alley .................... | H04L 25/4921 |
| 2023/0009129 A1* | 1/2023 | Stein ........................ | H04B 1/123 |
| 2023/0106890 A1* | 4/2023 | Ramian ................. | H04B 17/345 |
| | | | 375/224 |
| 2024/0353447 A1* | 10/2024 | Knierim ............. | G01R 13/0218 |
| 2024/0361377 A1* | 10/2024 | Lloyd ................ | G01R 31/2841 |

* cited by examiner

*Primary Examiner* — Raul J Rios Russo
(74) *Attorney, Agent, or Firm* — CHRISTENSEN O'CONNOR JOHNSON KINDNESS PLLC

(57) ABSTRACT

A measurement instrument for measuring a radio frequency signal is described. The measurement instrument includes a radio frequency input for receiving the radio frequency signal and at least one electronic component for processing the radio frequency signal. The at least one electronic component is configured to process the radio frequency signal based on a setting. The measurement instrument includes at least one interface that is configured to obtain resource information of at least one resource unit of the radio frequency signal received. The measurement instrument includes at least one circuit that is configured to adapt a setting of the at least one electronic component for level setting of the measurement instrument based on the resource information obtained.

20 Claims, 1 Drawing Sheet

100

200

MEASUREMENT INSTRUMENT FOR MEASURING A RADIO FREQUENCY SIGNAL

FIELD OF THE DISCLOSURE

The present disclosure relates to measurement instruments for measuring radio frequency signals and particularly to the aspect of level setting of these measurement instruments.

BACKGROUND

In radio frequency communications, orthogonal frequency-division multiplexing (OFDM) may be used, which is a type of digital transmission that is used in digital modulation for encoding digital data on multiple carrier frequencies. In OFDM, an incoming bit stream representing the data to be sent is divided into multiple streams. For transmitting purposes, multiple orthogonal subcarrier signals are used which are closely spaced and have overlapping spectra. The respective bits to be sent are allocated to the multiple orthogonal subcarrier signals.

In radio frequency measurements, accurate signal leveling is generally important for achieving high quality measurement results. Measurement instruments can perform an automatic level setting, which is often called automatic leveling (auto leveling). Currently used approaches for auto leveling have limitations regarding the quality of the ensuing measurement results, particularly when performing radio frequency measurements on OFDM signals. Some approaches rely on a determination of a quality measure like error vector magnitude (EVM) and are therefore comparatively slow.

SUMMARY

Measurement instruments and methods according to the present disclosure aim to address the issues described above or others. In some examples, aspects and embodiments of the present disclosure provide auto leveling that is fast and yields instrument settings associated with high quality measurement results.

The present disclosure provides a measurement instrument for measuring a radio frequency signal. In an embodiment, the measurement instrument comprises a radio frequency input for receiving the radio frequency signal and at least one electronic component for processing the radio frequency signal. The at least one electronic component is configured to process the radio frequency signal based on a setting. The measurement instrument also comprises at least one interface that is configured to obtain resource information of at least one resource unit of the radio frequency signal received. The measurement instrument further comprises at least one circuit that is configured to adapt a setting of the at least one electronic component for level setting of the measurement instrument based on the resource information obtained.

By using the resource information, specific characteristics of the received radio frequency signal can be taken into account for adapting the setting. For instance, the resource information provides information about the resource allocation. Accordingly, the resource information may relate to a resource element, namely the smallest unit that is made up of 1 symbol×1 subcarrier. In other words, the allocation per symbol and per subcarrier may be used for adapting the setting. A beneficial setting associated with high quality measurement results can thus be obtained, as information regarding the allocation is taken into account. For example, a signal-to-noise ratio can be optimized, while signal compression and clipping can be minimized.

In an embodiment, the measurement instrument may be a signal analyzer and/or a spectrum analyzer. The at least one electronic component may be part of an RF front end of the measurement instrument. The at least one electronic component may comprise, for example, an RF amplifier, for example a pre-amplifier, and/or an RF attenuator. The circuit is for example an electronic circuit.

A resource unit (RU) is to be understood as one unit of the physical resources in the time and the frequency domain available for transmission of the radio frequency signal. As an example, the dimensions of a RU may be one symbol in the time domain and one subcarrier in the frequency domain. In 5G NR, such a resource unit is called a resource element (RE), as already described above and detailed for example in the specification 3GPP TS 38.211, version 17.5.0 (particularly clause 4.4.3 thereof).

In an embodiment, the circuit may be configured to automatically adapt the setting of the at least one electronic component. The setting can thus be adapted without additional user involvement, enabling highly efficient signal measurements.

In an embodiment, level information of the radio frequency signal may be obtained by measuring a level of the radio frequency signal received. In this way, level information usable for adapting the setting of the at least one electronic component can be obtained from the received radio frequency signal.

In an embodiment, the at least one interface may be configured to also obtain level information of the radio frequency signal received, wherein the at least one circuit may be configured to determine a reference level based on the level information obtained and the resource information obtained.

In this regard, "configured to obtain level information" can be understood as the interface providing a signal path into the at least one circuit, so that the level information about the received signal can be determined by the circuit (automatically).

In an embodiment, the reference level is a maximum signal level expected at the radio frequency input. By using both the level information as well as the resource information, a particularly beneficial value for the reference level can be obtained, yielding settings associated with an improved quality of the measurement results.

According to one aspect, the resource information may comprise, for example, an indication whether the at least one resource unit is allocated or not. Hence, the allocation status of resource units can be taken into account when adapting the setting of the at least one electronic component. A quality of the measurement results can thus be increased. A resource unit being allocated may be understood as the resource unit being used for transmission of a symbol.

In an embodiment, the resource information may comprise an indication whether the resource unit is associated with a power boost. Hence, a boost status of resource units can be taken into account when adapting the setting of the at least one electronic component. A quality of the measurement results can thus be further increased.

For example, the resource information comprises an indication whether the resource unit is boosted. A boosted resource unit is particularly a resource unit transmitted at a higher power than remaining resource units.

In 5G NR for example, a power ratio can exist between symbols of the Physical downlink shared channel (PDSCH) and the demodulation reference signal (DM-RS). As one specific example, it is thus possible for the reference signal DM-RS to have a power boost relative to the PDSCH. For calculating the power ratio, the respective energy per resource element (EPRE) is used. Further details are described in the specification 3GPP TS 38.214, version 17.7.0 (particularly clause 4.1 thereof).

In an embodiment, the resource information may comprise an indication whether the at least one resource unit is relevant for an error vector magnitude calculation. Hence, resource units irrelevant for EVM calculation can be disregarded when adapting the setting of the at least one electronic component. A quality of the measurement results can thus be further increased.

In an embodiment, the resource information may be used for creating weighting or correction factors for adapting the setting of the at least one electronic component.

In an embodiment, the resource information may be used for creating a weighting factor regarding an influence on a noise floor of the radio frequency signal. Hence, the influence of a resource unit on the noise floor can be taken into account when adapting the setting of the at least one electronic component.

Additionally or alternatively, the resource information may be used for creating a weighting factor regarding an influence on a distortion of the radio frequency signal. Hence, the influence of a resource unit on the distortion can be taken into account when adapting the setting of the at least one electronic component.

In an embodiment, the resource information may be used for creating a correction factor regarding a power estimation. Hence, it may be controlled how strongly a resource unit influences the power estimation when adapting the setting of the at least one electronic component.

According to one aspect, a frequency-dependency of a noise figure of the measurement instrument, for example, may be taken into account. The frequency-dependency of the noise figure may be taken into account together with the resource information when adapting the setting of the at least one electronic component. Measurement accuracy can thus be further increased. The noise figure of the analyzer may vary due to hardware variations and for example a resulting frequency response correction.

In an embodiment, the resource information is obtained via a manual user input. A simple and flexible way of supplying the measurement instrument with the resource information can thus be provided. The measurement instrument can include a user interface for enabling a user to input the resource information.

Additionally or alternatively, the resource information may be obtained by accessing a data file comprising the resource information. The resource information can thus be obtained in a particularly efficient way. Moreover, since copies of a single data file may be used on a plurality of measurement instruments, a particularly scalable solution can thus be provided.

Moreover, the resource information may be obtained by processing the radio frequency signal received and automatically deriving the resource information from the processed radio frequency signal. Thus, the resource information can be obtained in a particularly user-friendly and efficient manner.

In an embodiment, the radio frequency signal may be an orthogonal frequency-division multiplexing signal. Orthogonal frequency-division multiplexing (OFDM) is a method used for transmitting signals in wireless networks, including for example 5G NR networks and wireless LAN (WLAN) networks. Problems of conventional approaches regarding accurate level setting of OFDM signals can be overcome by taking into account the resource information. OFDM signals can be challenging for conventional level setting approaches, for example due to the associated flexible allocation of resources in the time and the frequency domain.

According to one aspect, the radio frequency signal may be, for example, a 5G-NR signal. The resource unit can be a resource element, for example a resource element of the 5G NR resource grid. A definition of the 5G NR resource grid can be found for example in clause 4.4.2 of the specification 3GPP TS 38.211, version 17.5.0.

In an embodiment, the resource information may comprise an indication whether the at least one resource element is a part of a 5G NR preamble, for example the random access channel (RACH) preamble. Resource elements that are part of a preamble may be classified as irrelevant for EVM calculation.

If the resource element is part of a preamble, it may be disregarded when adapting the setting of the at least one electronic component. A quality of the measurement results can thus be further increased.

The present disclosure further provides an automatic leveling method for a measurement instrument. The measurement instrument comprises, for example, a radio frequency input and at least one electronic component. In an embodiment, the automatic leveling method comprises the steps of receiving a radio frequency signal by the radio frequency input, obtaining resource information about at least one resource unit of the radio frequency signal received; and adapting a setting of the at least one electronic component by using the resource information for level setting of the measurement instrument.

In an embodiment, the setting is automatically adapted. For example, the setting of the at least one electronic component may be adapted without additional user involvement.

According to one aspect, level information of the radio frequency signal, for example, may be obtained, wherein the level information is obtained by performing a level measurement on the radio frequency signal received via the radio frequency input.

Features and advantages described above with regard to the measurement instrument apply analogously to the automatic leveling method. Moreover, the automatic leveling method may be performed by the measurement instrument.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
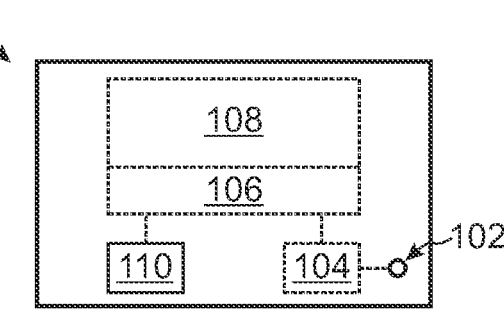
FIG. 1 is a schematic view of a measurement instrument according to an embodiment of the present disclosure.

FIG. 1 is a schematic view of a measurement instrument 100 for measuring a radio frequency signal according to an embodiment of the present disclosure. The measurement instrument 100 may be, for example, a signal analyzer and/or a spectrum analyzer.

In the embodiment shown, the measurement instrument 100 comprises a radio frequency input 102 for receiving the radio frequency signal. The radio frequency signal may be an orthogonal frequency-division multiplexing (OFDM) signal, for example a 5G-NR signal.

The measurement instrument 100 further comprises at least one electronic component 104 for processing the radio frequency signal. For example, the electronic component 104 is connected to the radio frequency input 102. The at least one electronic component 104 may be part of an RF front end of the measurement instrument 100. In an embodiment, the at least one electronic component 104 may comprise an RF amplifier, for example pre-amplifier, and/or an RF attenuator. The at least one electronic component 104 is configured to process the radio frequency signal based on a setting.

In an embodiment, the measurement instrument 100 further comprises at least one interface 106 that is configured to obtain resource information of at least one resource unit of the radio frequency signal received. The measurement instrument 100 also comprises at least one circuit 108 that is configured to adapt a setting of the at least one electronic component 104 for level setting of the measurement instrument 100 based on the resource information obtained. For example, the resource information is forwarded to the circuit 108 via the interface 106.

In this way, specific characteristics of the received radio frequency signal can be taken into account for adapting the setting. A particularly beneficial setting associated with high quality measurement results can thus be obtained. For example, a signal-to-noise ratio can be optimized, while signal compression and clipping can be minimized.

In an embodiment, the circuit 108 is an electronic circuit, and may be configured to automatically adapt the setting of the at least one electronic component 104.

In an embodiment, the resource information may be obtained via a manual user input. The user input may be inputted via the interface 106 that is connected with the circuit 108. Moreover, the at least one interface 106 may be connected to a set of USB ports 110. User input via connectable input devices can thus be enabled.

Additionally or alternatively, the resource information may be obtained by accessing a data file comprising the resource information. The data file may be located on an external device, for example on a storage device connected to one of the USB ports 110. Furthermore, the data file may be loaded via the at least one interface 106 directly.

In other embodiments, the resource information may be obtained by processing the radio frequency signal received and automatically deriving the resource information from the processed radio frequency signal. For example, the resource information is derived from the radio frequency signal via the circuit 108.

In an embodiment, the measurement instrument 100 may be configured to obtain level information of the radio frequency signal by measuring a level of the radio frequency signal received. For example, the at least one interface 106 may be configured to also obtain level information of the radio frequency signal received. In some instances, the interface 106 provides a signal path into the at least one circuit 108, so that the level information about the received signal can be determined by the circuit 108.

In an embodiment, the at least one circuit 108 may be configured to determine a reference level based on the level information obtained and the resource information obtained. For example, the reference level is a maximum signal level expected at the radio frequency input 102.

In an embodiment, the resource information may comprise an indication whether the at least one resource unit is allocated or not. A resource unit being allocated may be understood as the resource unit being used for transmission of a symbol.

Further, the resource information may comprise an indication whether the resource unit is associated with a power boost. For example, the resource information comprises an indication whether the resource unit is boosted. A boosted resource unit is particularly a resource unit transmitted at a higher power than remaining resource units.

In an embodiment, the resource information may comprise an indication whether the at least one resource unit is relevant for an error vector magnitude (EVM) calculation. Hence, resource units irrelevant for EVM calculation can be disregarded when adapting the setting of the at least one electronic component 104.

In an embodiment, the resource information may be used for creating weighting or correction factors for adapting the setting of the at least one electronic component 104. For example, the resource information may be used for creating a weighting factor regarding an influence on a noise floor of the radio frequency signal. The resource information may also be used for creating a weighting factor regarding an influence on a distortion of the radio frequency signal. Moreover, the resource information may be used for creating a correction factor regarding a power estimation.

A frequency-dependency of a noise figure of the measurement instrument 100 may be taken into account. The frequency-dependency of the noise figure may be taken into account together with the resource information when adapting the setting of the at least one electronic component 104.

Figure 2:
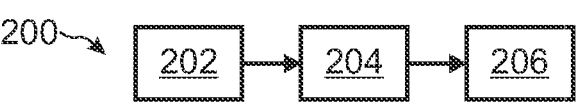
FIG. 2 is a flowchart illustrating an example of an automatic leveling method according to an aspect of the present disclosure.

FIG. 2 is a flowchart illustrating an example of an automatic leveling method 200 for a measurement instrument 100 according to an aspect of the present disclosure. The measurement instrument 100, for example as described above with regard to FIG. 1, comprises a radio frequency input 102 and at least one electronic component 104.

The automatic leveling method 200 comprises a step 202 of receiving a radio frequency signal by the radio frequency input 102. The method further comprises a step 204 of obtaining resource information about at least one resource unit of the radio frequency signal received. In addition, the method comprises a step 206 of adapting a setting of the at least one electronic component 104 by using the resource information for level setting of the measurement instrument 100. The setting may be automatically adapted.

Moreover, level information of the radio frequency signal may be obtained. The level information is obtained, for example, by performing a level measurement on the radio frequency signal received via the radio frequency input 102.

Figure 3:
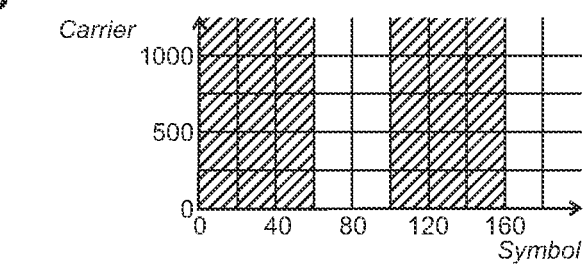
FIG. 3 is a schematic diagram illustrating a bursty allocation of signal transmission resources in the time and frequency domain.
Figure 4:
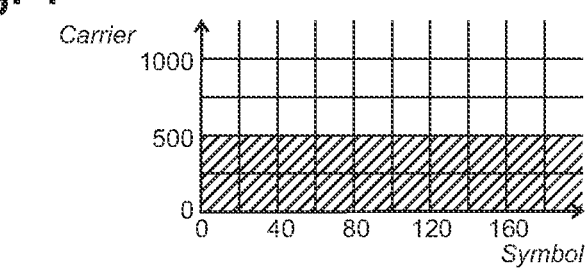
FIG. 4 is a schematic diagram illustrating a narrowband allocation of signal transmission resources in the time and frequency domain.
Figure 5:
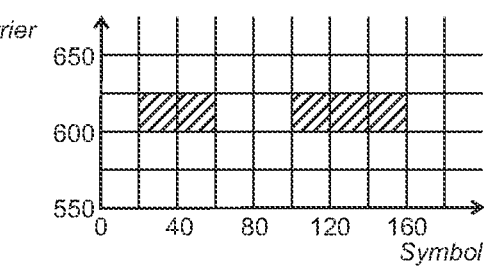
FIG. 5 is a schematic diagram illustrating a sparse allocation of signal transmission resources in the time and frequency domain.

FIGS. 3-5 are schematic diagrams illustrating allocations of signal transmission resources in the time and frequency domain. The x-axis relates to symbol numbers in the time domain and the y-axis relates to subcarrier numbers in the frequency domain. Allocated resources are indicated by hatched areas. In an embodiment, the symbols are OFDM symbols.

In FIG. 3, a burst allocation of resources is depicted. As can be seen, the allocations are discontinuous in time. A narrowband allocation of resources is shown in FIG. 4. Here, only a comparatively small part of the available subcarriers is allocated. FIG. 5 illustrates a sparse allocation of resources. The allocations are narrowband and discontinuous in time.

As can be appreciated in view of the examples shown in FIGS. 3-5, different OFDM signals can have substantial individual characteristics, which constitutes a challenge for conventional automatic levelling approaches. By obtaining and using resource information for level setting, measurement instruments and methods according to the present disclosure can take into account the specific characteristics of the signal. Thus, level setting yielding higher quality measurement results can be provided.

For instance, only allocated resource units, e.g. resource elements, are taken into account for performing the measurement, thereby obtaining more accurate measurement results.

Generally, the resource units relevant for the specific measurement, e.g. EVM measurement, are taken into consideration for performing the adaption of the setting, e.g. determining weighting factors and/or correction factors.

Certain embodiments disclosed herein include systems, apparatus, modules, components, etc., that utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

For example, the functionality described herein can be implemented by special purpose hardware-based computer systems or circuits, etc., or combinations of special purpose hardware and computer instructions. Each of these special purpose hardware-based computer systems or circuits, etc., or combinations of special purpose hardware circuits and computer instructions form specifically configured circuits, machines, apparatus, devices, etc., capable of implemented the functionality described herein.

Of course, in some embodiments, two or more of these components, or parts thereof, can be integrated or share hardware and/or software, circuitry, etc. In some embodiments, these components, or parts thereof, may be grouped in a single location or distributed over a wide area. In circumstances where the components are distributed, the components are accessible to each other via communication links.

In some embodiments, one or more of the components, including but not limited to the measurement instrument 100, the interface 106, the circuit 108, etc., referenced above include circuitry programmed to carry out one or more steps of any of the methods disclosed herein. In some embodiments, one or more computer-readable media associated with or accessible by such circuitry contains computer readable instructions embodied thereon that, when executed by such circuitry, cause the component or circuitry to perform one or more steps of any of the methods disclosed herein.

In some embodiments, the computer readable instructions includes applications, programs, program modules, scripts, source code, program code, object code, byte code, compiled code, interpreted code, machine code, executable instructions, and/or the like (also referred to herein as executable instructions, instructions for execution, program code, computer program instructions, and/or similar terms used herein interchangeably).

In some embodiments, computer-readable media is any medium that stores computer readable instructions, or other information non-transitorily and is directly or indirectly accessible to a computing device, such as processor circuitry, etc., or other circuitry disclosed herein etc. In other words, a computer-readable medium is a non-transitory memory at which one or more computing devices can access instructions, codes, data, or other information. As a non-limiting example, a computer-readable medium may include a volatile random access memory (RAM), a persistent data store such as a hard disk drive or a solid-state drive, or a combination thereof. In some embodiments, memory can be integrated with a processor, separate from a processor, or external to a computing system.

Accordingly, blocks of the block diagrams and/or flow-chart illustrations support various combinations for performing the specified functions, combinations of operations for performing the specified functions and program instructions for performing the specified functions. These computer program instructions may be loaded onto one or more computer or computing devices, such as special purpose computer(s) or computing device(s) or other programmable data processing apparatus(es) to produce a specifically-configured machine, such that the instructions which execute on one or more computer or computing devices or other programmable data processing apparatus implement the functions specified in the flowchart block or blocks and/or carry out the methods described herein. Again, it should also be understood that each block of the block diagrams and flowchart illustrations, and combinations of blocks in the block diagrams and/or flowchart illustrations, or portions thereof, could be implemented by special purpose hardware-based computer systems or circuits, etc., that perform the specified functions or operations, or combinations of special purpose hardware and computer instructions.

In the foregoing description, specific details are set forth to provide a thorough understanding of representative embodiments of the present disclosure. It will be apparent to one skilled in the art, however, that the embodiments disclosed herein may be practiced without embodying all of the specific details. Thus, in the detailed description herein, references to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. In addition, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments. Thus, it will be appreciated that embodiments of the present disclosure may employ any combination of features described herein. All such combinations or sub-combinations of features are within the scope of the present disclosure.

Although the method and various embodiments thereof have been described as performing sequential steps, the claimed subject matter is not intended to be so limited. As nonlimiting examples, the described steps need not be performed in the described sequence and/or not all steps are required to perform the method. In some instances, well-known process steps have not been described in detail in order not to unnecessarily obscure various aspects of the present disclosure. Moreover, embodiments are contemplated in which various steps are performed in parallel, in series, and/or a combination thereof. As such, one of ordinary skill will appreciate that such examples are within the scope of the claimed embodiments.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

Throughout this specification, terms of art may be used. These terms are to take on their ordinary meaning in the art from which they come, unless specifically defined herein or the context of their use would clearly suggest otherwise.

The drawings in the FIGURES are not to scale. Similar elements are generally denoted by similar references in the FIGURES. For the purposes of this disclosure, the same or similar elements may bear the same references. Furthermore, the presence of reference numbers or letters in the drawings cannot be considered limiting, even when such numbers or letters are indicated in the claims.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A measurement instrument for measuring a radio frequency signal, wherein the measurement instrument comprises:
   a radio frequency input for receiving the radio frequency signal;
   an RF front end with at least one electronic component for processing the radio frequency signal, wherein the at least one electronic component is configured to process the radio frequency signal based on a setting;
   at least one interface that is configured to obtain resource information regarding resource allocation of at least one resource unit in a time-frequency resource grid of the radio frequency signal received, wherein the radio frequency signal is an orthogonal frequency-division multiplexing signal; and
   at least one circuit that is configured to adapt a setting of the at least one electronic component of the RF front end for level setting of the measurement instrument based on the resource information obtained.

2. The measurement instrument according to claim 1, wherein the circuit is configured to automatically adapt the setting of the at least one electronic component.

3. The measurement instrument according to claim 1, wherein level information of the radio frequency signal is obtained by measuring a level of the radio frequency signal received.

4. The measurement instrument according to claim 1, wherein the at least one interface is configured to also obtain level information of the radio frequency signal received, and wherein the at least one circuit is configured to determine a reference level based on the level information obtained and the resource information obtained.

5. The measurement instrument according to claim 1, wherein the resource information comprises an indication whether the at least one resource unit is allocated or not.

6. The measurement instrument according to claim 1, wherein the resource information comprises an indication whether the resource unit is associated with a power boost.

7. The measurement instrument according to claim 1, wherein the resource information comprises an indication whether the at least one resource unit is relevant for an error vector magnitude calculation.

8. The measurement instrument according to claim 1, wherein the resource information is used for creating weighting or correction factors for adapting the setting of the at least one electronic component.

9. The measurement instrument according to claim 1, wherein the resource information is used for creating a weighting factor regarding an influence on a noise floor of the radio frequency signal.

10. The measurement instrument according to claim 1, wherein the resource information is used for creating a weighting factor regarding an influence on a distortion of the radio frequency signal.

11. The measurement instrument according to claim 1, wherein the resource information is used for creating a correction factor regarding a power estimation.

12. The measurement instrument according to claim 1, wherein a frequency-dependency of a noise figure of the measurement instrument is taken into account.

13. The measurement instrument according to claim 1, wherein the resource information is obtained via a manual user input.

14. The measurement instrument according to claim 1, wherein the resource information is obtained by accessing a data file comprising the resource information.

15. The measurement instrument according to claim 1, wherein the resource information is obtained by processing the radio frequency signal received and automatically deriving the resource information from the processed radio frequency signal.

16. The measurement instrument according to claim 1, wherein the radio frequency signal is a 5G-NR signal.

17. An automatic leveling method for a measurement instrument, wherein the measurement instrument comprises a radio frequency input and an RE front end with at least one electronic component, the automatic leveling method comprises the steps of:

receiving a radio frequency signal by the radio frequency input, wherein the radio frequency signal is an orthogonal frequency-division multiplexing signal;

obtaining resource information regarding resource allocation about at least one resource unit in a time-frequency resource grid of the radio frequency signal received; and adapting a setting of the at least one electronic component of the RF front end by using the resource information for level setting of the measurement instrument.

18. The method of claim 17, wherein the setting is automatically adapted.

19. The method of claim 17, wherein level information of the radio frequency signal is obtained, and wherein the level information is obtained by performing a level measurement on the radio frequency signal received via the radio frequency input.

20. A measurement instrument for measuring a radio frequency signal, wherein the measurement instrument comprises:

a radio frequency input for receiving the radio frequency signal;

at least one electronic component for processing the radio frequency signal, wherein the at least one electronic component is an RF amplifier or an RF attenuator, wherein the at least one electronic component is configured to process the radio frequency signal based on a setting;

at least one interface that is configured to obtain resource information regarding resource allocation of at least one resource unit in a time-frequency resource grid of the radio frequency signal received; and at least one circuit that is configured to adapt a setting of the at least one electronic component for level setting of the measurement instrument based on the resource information obtained.

\* \* \* \* \*